United States Patent [19]
Chen et al.

[11] Patent Number: 5,350,336
[45] Date of Patent: Sep. 27, 1994

[54] BUILDING AND METHOD FOR MANUFACTURE OF INTEGRATED SEMICONDUCTOR CIRCUIT DEVICES

[75] Inventors: Hsing-Hai Chen; Hsiao-Pin Tseng, both of Hsinchu; Chih-Yuan Lu, Taipei, all of Taiwan

[73] Assignee: Industrial Technology Research Institute, Hsinchu, Taiwan

[21] Appl. No.: 51,381

[22] Filed: Apr. 23, 1993

[51] Int. Cl.⁵ ............................................. F24F 3/16
[52] U.S. Cl. .................................... 454/187; 55/385.2
[58] Field of Search ............... 454/187, 228, 230, 233, 454/236; 55/385.2

[56] References Cited

U.S. PATENT DOCUMENTS

| | | | |
|---|---|---|---|
| 4,534,389 | 8/1985 | Tullis | 141/98 |
| 4,549,472 | 10/1985 | Endo et al. | 454/187 |
| 4,674,936 | 6/1987 | Bonora | 414/217 |
| 4,693,175 | 9/1987 | Hashimoto | 454/187 |
| 4,724,874 | 2/1988 | Parikh et al. | 141/98 |
| 4,781,511 | 11/1988 | Harada et al. | 414/217 |
| 4,826,360 | 5/1989 | Iwasawa et al. | 406/51 |
| 5,058,491 | 10/1991 | Weimer et al. | |
| 5,167,575 | 12/1992 | MacDonald | 454/187 |

FOREIGN PATENT DOCUMENTS

| | | | |
|---|---|---|---|
| 464144 | 2/1987 | Japan | 454/187 |
| 201441 | 8/1988 | Japan | 454/187 |
| 243645 | 10/1988 | Japan | 454/187 |
| 38539 | 2/1989 | Japan | 55/385.2 |
| 102232 | 4/1989 | Japan | 55/385.2 |
| 243882 | 9/1990 | Japan | 454/187 |
| 291436 | 12/1991 | Japan | 454/187 |

OTHER PUBLICATIONS

Stephen Titus et al., "Defect Density Reduction in a Class 100 Fab Utilizing The Standard Mechanical Interface", *Solid State Technology*, PennWell Publishing Company, Nov. 1987.

Primary Examiner—Harold Joyce
Attorney, Agent, or Firm—George O. Saile; Wolmar J. Stoffel

[57] ABSTRACT

A manufacturing plant is described for producing semiconductors that will function at a low production level during the initial phase. The plant can be expanded to provide a greater production volume with minimum additional investment, minimum disruption to the existing manufacturing line, and can be done quickly at minimum cost. Also described is a method for building a manufacturing plant for integrated circuit devices that can be operated at a low level during the initial phase, and provides for an efficient and rapid expansion to a higher level of manufacturing with minimum cost, and disruption to the existing line.

18 Claims, 8 Drawing Sheets

BUILDING AND METHOD FOR MANUFACTURE OF INTEGRATED SEMICONDUCTOR CIRCUIT DEVICES

BACKGROUND OF THE INVENTION (1) Field of the Invention

The present invention relates to a building for manufacturing highly dense, most advanced integrated circuits that is designed for manufacturing integrated circuits.

(2) Description of the Prior Art

There continues to be a dramatic increase in the complexity of integrated circuits each year. As applications develop for memories, microprocessor and minicomputers there is an increasing demand for greater complexities, greater switching speeds, and smaller devices in the integrated circuits.

The manufacturing or fabrication building design for integrated circuits has not kept up with the progress of the technologies for the manufacture of integrated circuits. The shortcoming in design has involved the clean room in which the processing equipment for making the integrated circuits is located. The clean room is of utmost importance because airborne contamination particles cause defects in the integrated circuits to the point that there is zero yield from the manufacture.

The present design for manufacturing or fabrication buildings for integrated circuits involve maintaining a clean room by air circulation and filtering equipment for the whole manufacturing area at the highest possible clean room class. The U.S. Federal Standard No. 209d maintains the definition of the Classes from Class 100,000 down to Class 1. The most desired clean room today is much better than Class 1. However, the ability to design buildings with clean rooms of such classes is difficult due to the requirement of human workers, a major source of particulate contamination in the clean room and the substantial construction cost of accomplishing such a design.

One approach to upgrade existing clean rooms to higher air cleanliness has been described in the paper "Defect Density Reduction in a Class 100 Fab Utilizing the Standard Mechanical Interface" by Stephen Titus et al published in November 1987 issue of Solid State Technology. The photoresist coater and mask aligner on the manufacturing floor were fitted with an environmental enclosures with laminar air flow which provides near Class 1 ambient directly above the wafer processing area, and a robotic interface. A sealed wafer carrier which isolates the cassette of wafers from the environment was used to move the wafers throughout the clean room except when the robotic interface removes the wafer cassette into the coater or mask aligner. The experiment was stated as successful in the publication. The use of these structures in a wafer-fabrication building is described in the paper "VTC's Submicron CMOS Factory" by Wilton Workman et al in Microcontamination, October 1987. However, there is no description of methods for mobility or the adding/removal of processing equipment in an easy or quick manner in either of these papers. There are patents describing the details of this system involving the wafer cassette pod and robotic interfaces which include U.S. Pat. No. 4,534,389; U.S. Pat. No. 4,674,936; U.S. Pat. No. 4,724,874; U.S. Pat. No. 4,781,511; and U.S. Pat. No. 4,826,360. A state of the art manufacturing plant is described in U.S. Pat. No. 5,058,491.

In the normal course of development, the manufacturing of integrated circuit devices consists of an initial phase where the volume of manufacture is relatively low. The volume is low because this is somewhat of a learning, or development phase, where the yield is likely to be low due to breaking in of the process equipment and the experimentation necessary to determine the optimum operating parameters of the equipment. It is desirable that mistakes that inevitably occur, be limited to as small a scale as possible. The circuits manufactured in any new lab have to pass a series of qualification tests with an average duration of six months before they can be delivered to the customers. Also, there may be a lack of demand for the product at its early stages. However, as time progresses, the demand for the product will normally increase, thus requiring that the manufacturing line be enlarged. This expansion is very expensive, since it may require a major modification of the manufacturing building and its clean room area. Also, the existing manufacturing line may have to close down during expansion of the line, since maintenance of a clean environment is not feasible when new equipment is being installed and the clean room environment is enlarged. Enlarging the manufacturing line contained in a clean room environment involves constructing the clean area, installing ducts to supply air, installing air filters in the ceiling to clean the air, building a raised floor, installing manufacturing equipment, constructing an exhaust system to withdraw fumes and gases from the machines, constructing supply lines for the various gases and liquids necessary to operate the machines, connecting the supply lines to the machines, and providing electricity to light the area and power the machines. In expanding the manufacturing line, the same expensive construction operations required to build the initial manufacturing line are normally duplicated. It is normally not feasible to construct the manufacturing line to meet the requirements of the final phase, since (1) it would entail a very large capital expenditure and operational cost, and (2) the requirements are not always correctly anticipated at the early initial stage of manufacture, which might then require major expensive modifications.

What is needed in the industry is a plant, and a method, that will effectively function during the initial manufacturing phase and require a minimum capital investment, but which can be later expanded with virtually no down time to provide greater production volume with minimum additional investment, minimum disruption to the line, and the flexibility to accommodate unanticipated modifications.

SUMMARY OF THE INVENTION

It is an object of the invention to provide a manufacturing plant for producing semiconductors that will function at a low production level during the initial phase, but which can be expanded to provide a greater production volume with minimum additional investment, minimum disruption to the existing manufacturing line, and which can be done quickly at minimum cost.

It is a further object of the invention to provide a method for building a manufacturing plant for integrated circuit devices that can be operated at a low level during the initial phase, but provides for an efficient and rapid expansion to a higher level of manufacturing with minimum cost, and disruption to the existing line.

In accordance with the aforementioned objectives, a manufacturing plant and a method of building and expanding a manufacturing plant is presented. The manufacturing plant includes a containment building with a manufacturing equipment floor, and a lower floor. The equipment floor has an enclosed process aisle, a plurality of spaced orthogonally positioned tunnels connected to the process aisle, a means to provide clean air to the aisle and tunnel, including a plenum over the tunnels and aisle, temporary walls across the tunnels to enclose the initial area necessary to house the equipment for an initial phase, filters over the initial area with impervious plates over the remaining area, fluid supply lines beneath the tunnels necessary to service process equipment, process equipment in the initial area, and plumbing connections joining the fluid supply lines to the process equipment.

Further, in accordance with the present invention, there is described a method of building a plant for manufacturing integrated circuit devices wherein a containment building with a manufacturing floor and lower floor is constructed, an aisle and spaced tunnels are constructed on the manufacturing floor with a plenum above the ceilings. Partitions are constructed across the tunnels to enclose the area necessary for housing the process equipment needed for the initial phase of manufacturing, and the process equipment installed only in the initial area. Fluid supply lines are installed beneath the tunnels to service the entire tunnel area, and the process equipment connected thereto. Air filters are installed in the ceiling of the initial areas, and impervious plates installed over the remaining area of the tunnels. When the manufacturing line is expanded, additional process equipment is installed in the tunnels beyond the partitions, connected to the supply lines, the impervious plates replaced with filters, and the partitions opened.

DESCRIPTION OF THE PREFERRED EMBODIMENTS

Figure 1:
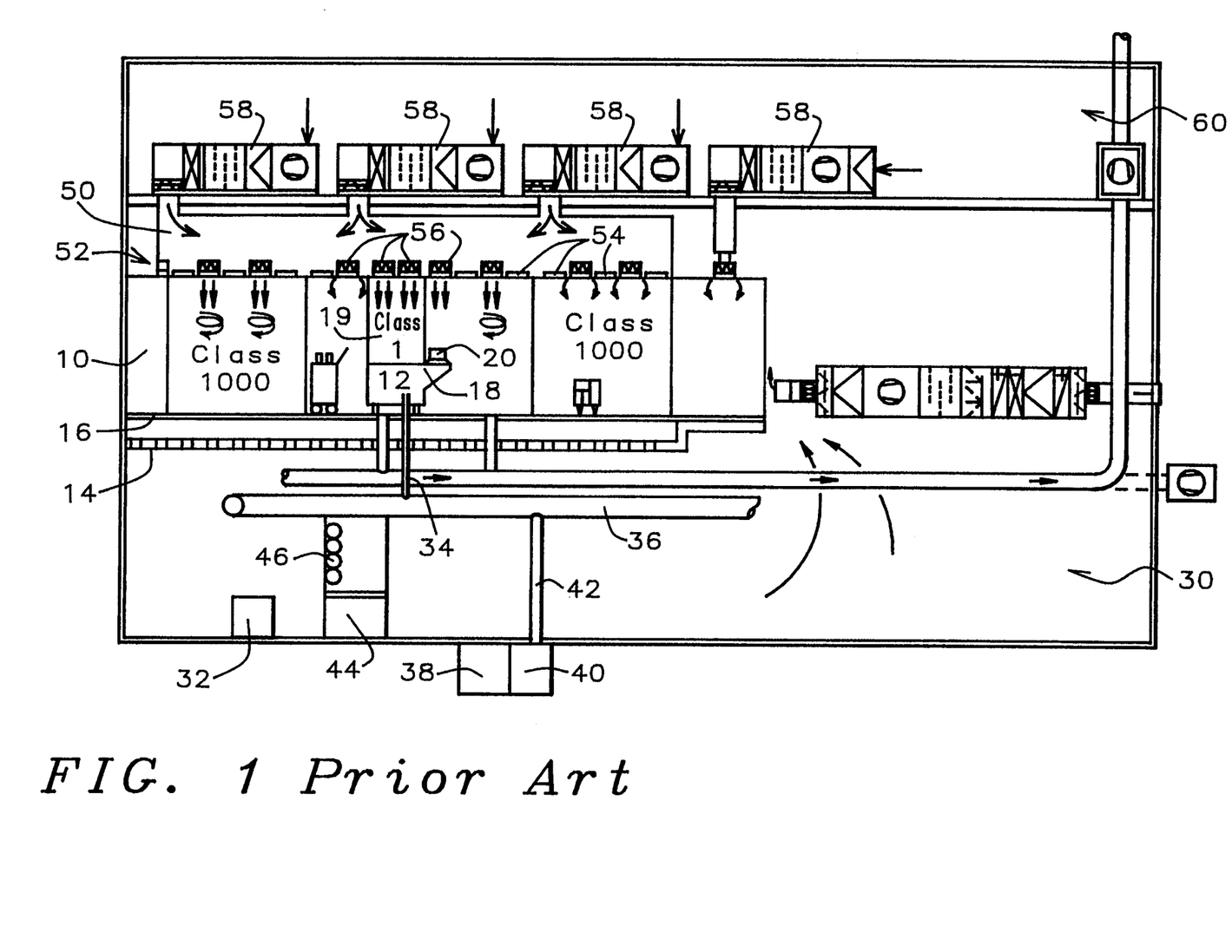
FIG. 1 is a cross sectional view of a manufacturing plant known to the prior art.

Referring now to FIG. 1 there is illustrated a building for housing a manufacturing line, that includes a clean environment for manufacturing integrated circuit semiconductor devices that is known to the prior art. This Prior Art is U.S. Pat. No. 5,059,491 K. C. Wiemer et al. This building includes a manufacturing equipment floor 10 with processing equipment 12 for the manufacture of integrated circuits supported upon the floor. The floor construction is preferably a waffle slab 14 which is made of reinforced concrete having opening of typically 40 cm. by 40 cm. in size.

A raised floor 16 is located above the waffle slab 14. This floor is composed of a floor stand (pedestal) system. Floor panels, typically 60 cm. by 60 cm. are placed on top of the pedestals. The floor tiles and pedestals are designed to meet the loading and seismic requirements and the tiles are covered with an electrically, non-conductive material. The alternate is a steel system totally grounded. The processing equipment 12 which perform the various fabrication operations upon the semiconductor wafers to ultimately form a complete integrated circuit are positioned upon the raised floor.

A lower floor 30 is located below the manufacturing floor. This floor has the purpose of supporting equipment that need not be in the clean room class of the manufacturing floor 10, but is nonetheless needed for the manufacture of the integrated circuits. For example, there are normally supporting equipment 32 that are associated with each piece of processing equipment 12. This type of equipment 32 would include motors, blowers, power supplies, heat exchangers, chemical transfer cabinets, etc.

The air/gas handling system is also located at the lower floor level. This system handles the air/gas that is exhausted from the pieces of processing equipment 12 on the manufacturing floor. This system includes exhaust piping 34 and multiple ringed branched headers 36.

There are trenches in the lower floor 30. There are at least two trenches 38 and 40 which are designated to handle separately the toxic gases and the general air in the air/gas flow within the building. Other trenches could be used to handle certain toxic gases from certain processing equipment through a particular ringed header system. Vertical headers 42 allow the flow of the toxic gases from the ringed headers 36 to the toxic gas trench 40. The toxic gases from trench 40 are moved into appropriate scrubbers 41 and other air purifying equipment (not shown) for cleaning and the resulting highly purified air is exhausted. The general air from trench 38 is moved via fan units directly to the atmosphere.

There is also located at various points of the lower floor raised walkways 44 at suitable heights, such as 2 meters above the floor that allows workers to easily reach piping or electrical conduits 46, the multiple ringed branch headers 36, exhaust pipes 34, vertical headers 42 and the like. These walkways also allow for the easy movement for workers and equipment below the walkways 44.

The upper floor 60 above the manufacturing floor 10 is for supporting the air handling systems that include the air handling units (AHU) 58 and the plenum system 50.

The operation of the localized Class 1 or below clean room system may be more fully understood with reference to PRIOR ART FIG. 1. This Prior Art is U.S. Pat. No. 5,059,491 K. C. Wiemer et al. FIG. 1 shows the details of the processing equipment 12, SMIF (Standard Mechanical Interface) handler 18, enclosure 19, and plenum system 50 with its ceiling or bottom portion 52 with blank plates 54 and filter plates 56. The processing equipment 12 that is open to the wafers wherein the integrated circuits are being fabricated are only exposed to Class 1 air that is moving through the enclosure 19 in a laminar flow condition. The flow is typically 0.45 meters/sec. The enclosure 19 is a simple box-like structure made of rigid plastic panels with metal supports that has the function of isolating the clean air of Class 1 or below from the surrounding areas of a higher class of clean air such as Class 1000. The air flow in the Class 1000 areas are typically 0.1 meters/sec.

The SMIF (Standard Mechanical Interface) handler 18 may be of various designs which allow the movement of a container 20 having a cassette of wafers into the pieces of processing equipment 12. One design is shown, for example in U.S. Pat. No. 4,474,939 wherein the container is moved by a human into the receiving port of the handler from where the container and wafer cassette is moved into the clean Class 1 air of the processing equipment. The container 20 is also maintained at Class 1 purity by its construction even while it moves through the surrounding areas. The movement of these containers can also be automated as described for example in U.S. Pat. No. 4,826,360. The containers 20 themselves can be of various designs.

The clean air of Class 1000 or Class 1 is provided to the manufacturing floor 10 environment by ceiling or bottom portion of the plenum 50 construction in conjunction with the air handling system 58. The interchangeable means associated with the plenum system 50 which quickly allow the change of location of the input of clean air from one class of clean air purity to another class of clean air purity is preferred to be blank plates 54 and filter plates 56. The blank plates 56 have the function of preventing air from the plenum system 50 from reaching the environment of the manufacturing floor 10 from the area that it covers. The filter 56 includes a filter structure that removes particulate contamination. The preferred filter structure is a metal or wooden treated frame with a totally sealed paper pleated packing. The specification must meet or exceed U.S. 209d Federal Standards. Such a filter is manufactured by Solfiltra Company in France.

The air handling unit 58 also may contain filtering capacity as well as air movement capabilities. This unit 58 dependant upon manufacturing requirements, a typical unit would consist of a fan, cooling coils and a 85% post filter. The filter is periodically changed.

The air passing through the processing equipment 12 picks up some toxic gases in some of the pieces of equipment. The exhaust of the air/gas moves into the air/gas handling system that includes the exhaust pipes 34 and the Multiple ringed branch headers 36. The treatment of this exhaust toxic gas was considered above.

Figure 2:
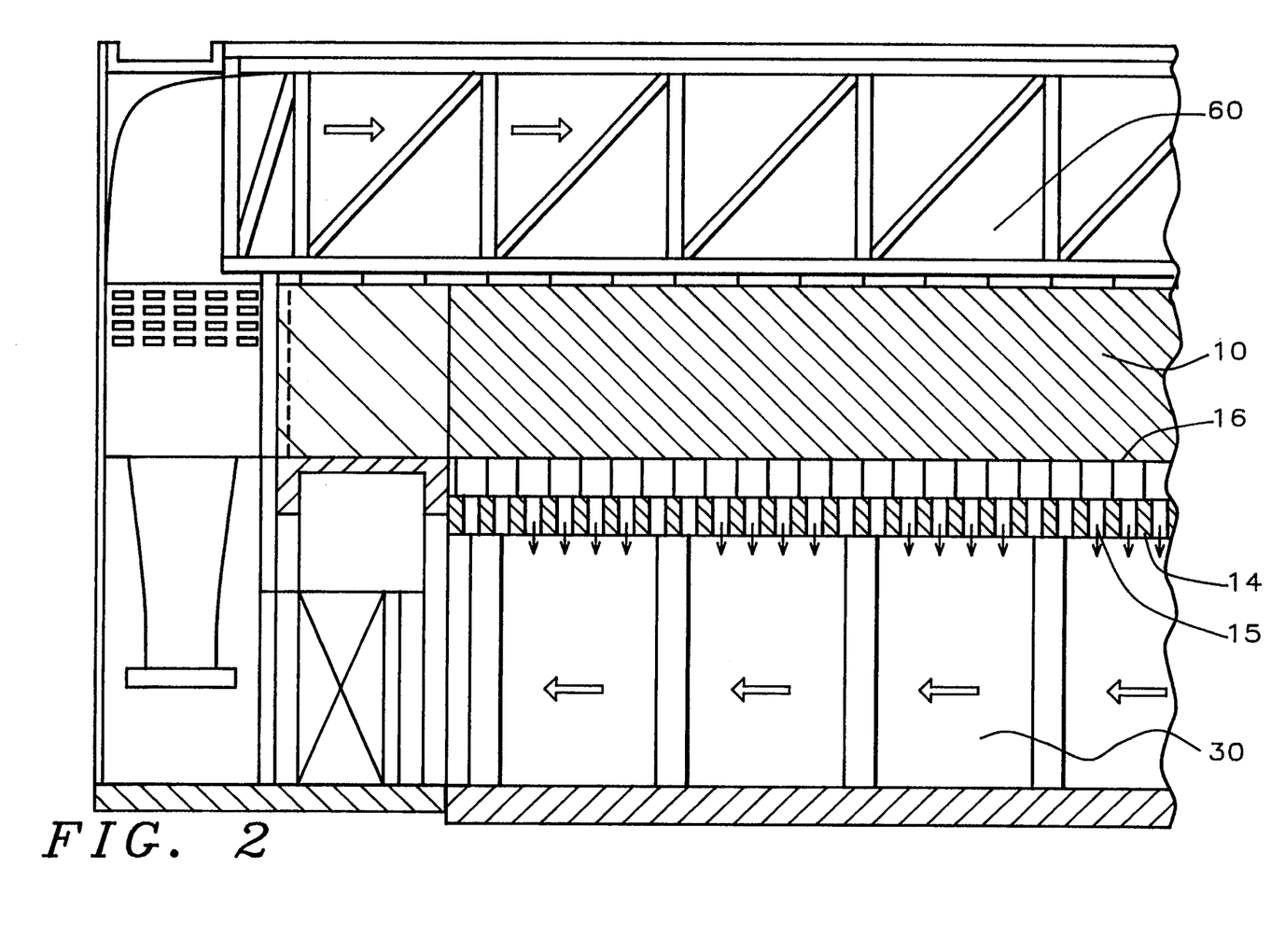
FIG. 2 is a cross sectional view of a building used to house the manufacturing plant of the invention.
Figure 3:
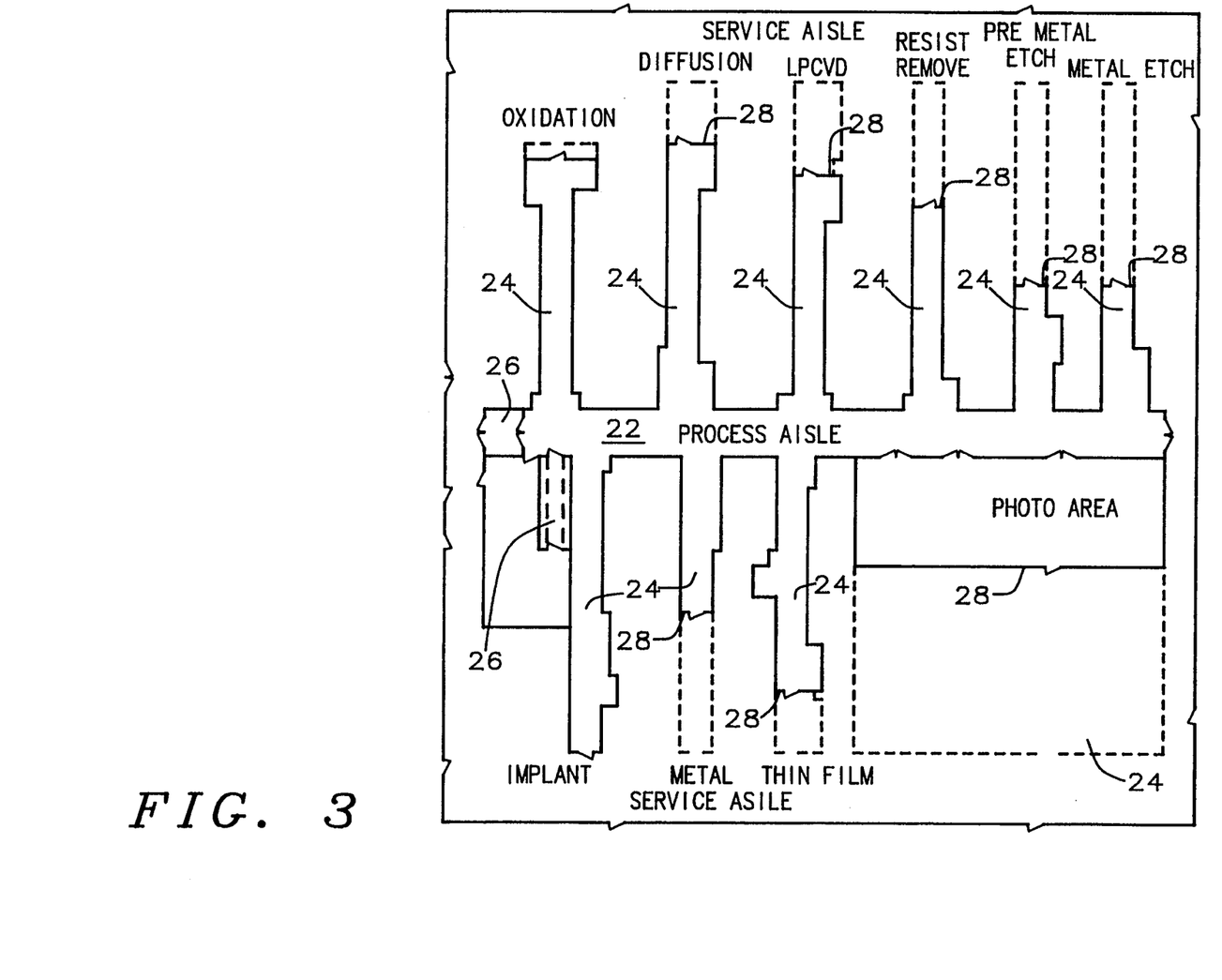
FIG. 3 is a top plan view illustrating a preferred specific embodiment of the manufacturing plant of the invention in the initial phase for low volume manufacturing.
Figure 4:
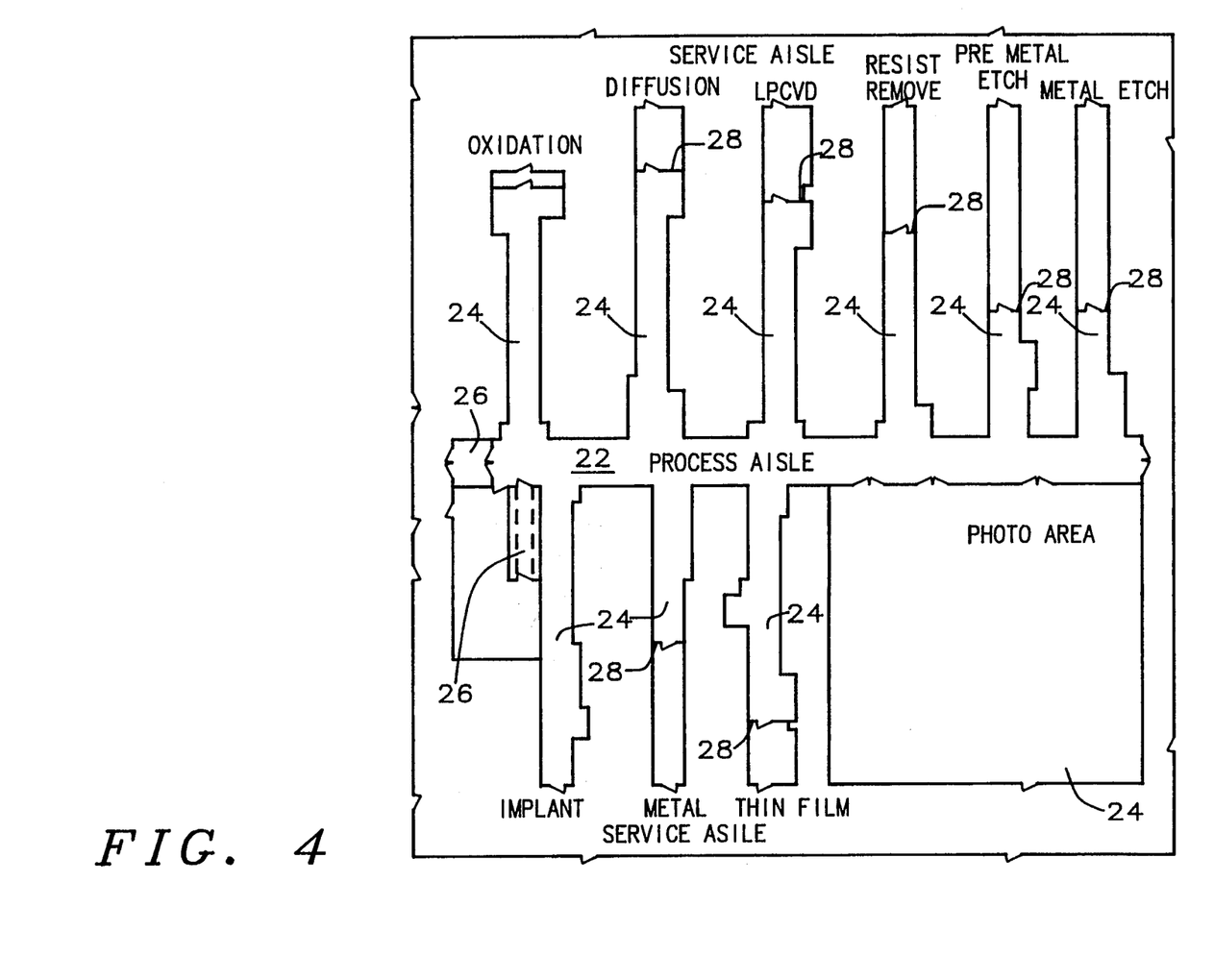
FIG. 4 is a top plan view of the embodiment shown in FIG. 3, but expanded to the final phase for high volume manufacturing.
Figure 5A:
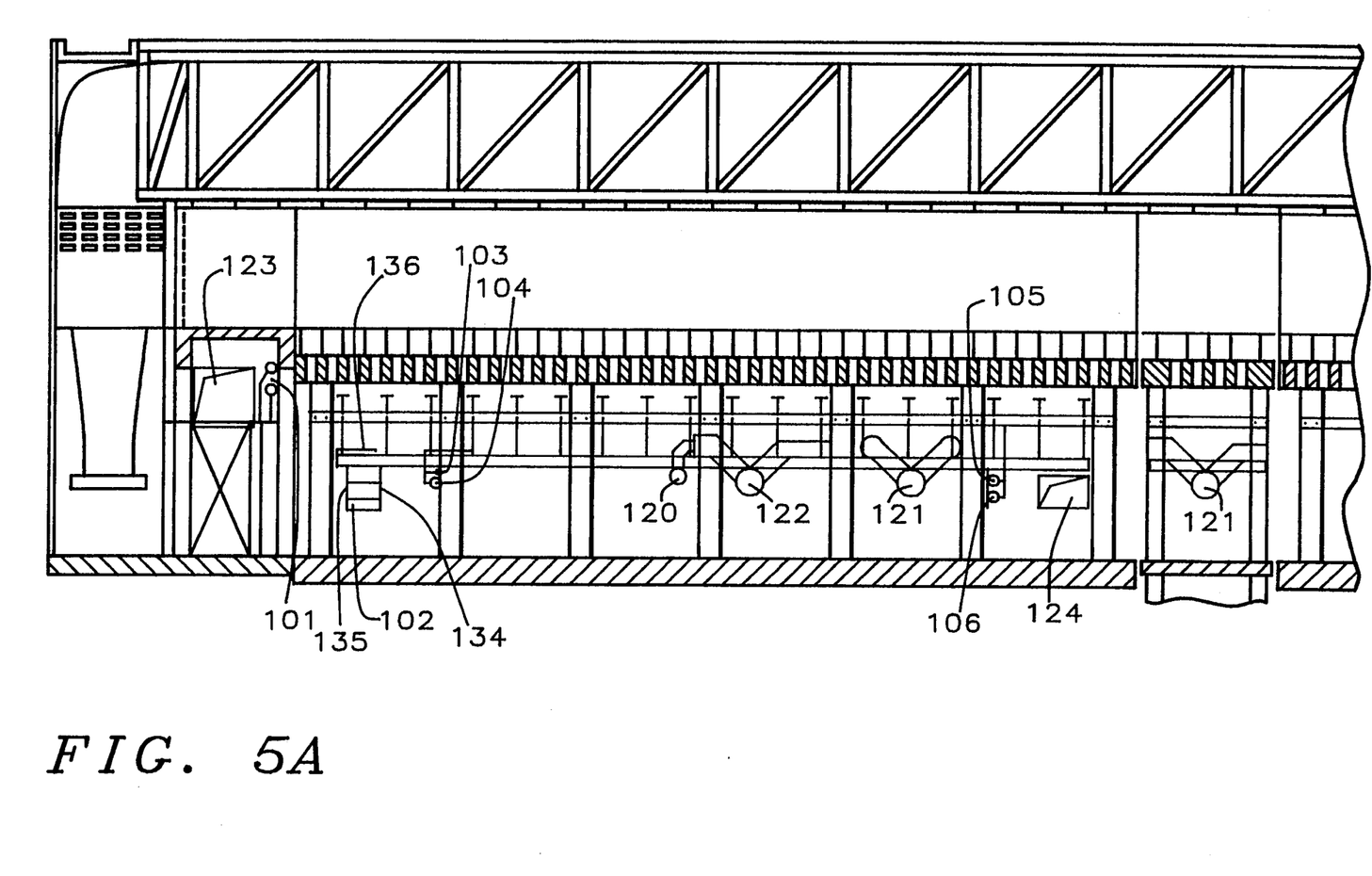
FIG. 5A is a cross sectional view from one side of a section of the manufacturing plant that illustrates the lower floor and arrangement of supply lines and exhaust lines.
Figure 5B:
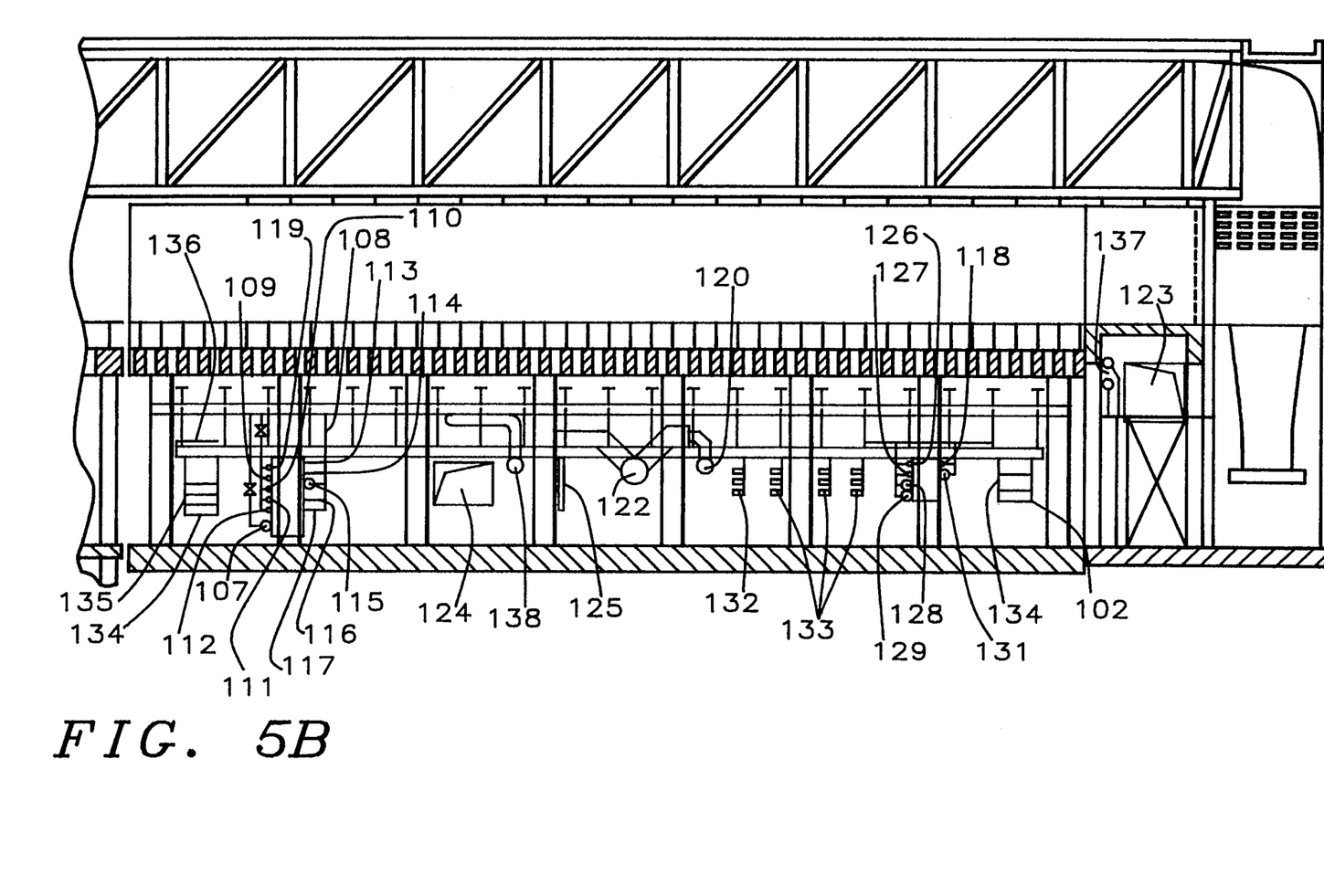
FIG. 5B is a cross sectional view from the other side (opposite of FIG. 5A) of a section of the manufacturing plant that illustrates the lower floor and arrangement of supply lines and exhaust lines.
Figure 6:
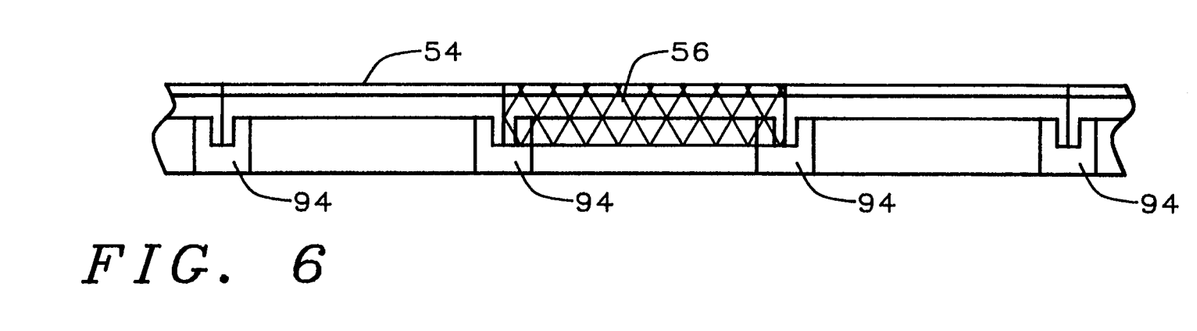
FIG. 6 is a cross sectional view illustrating the ceiling detail of the tunnels.

Referring now to FIGS. 2 through 8, the plant system and method of the invention will be described. The manufacturing plant of the invention embodies a clean area located on a manufacturing floor, and many of the elements described in FIG. 1, but used and arranged in a specific manner. The common elements have been assigned similar numerals. In FIG. 2 there is depicted a containment building having a manufacturing floor 10, a lower floor 30, and an upper floor 60. Floor 10 embodies a concrete slab 14 having spaced opening 15 and a raised floor 16. Referring now to FIG. 3 the clean area is depicted. The clean area consists of a process aisle 22 on floor 10, with tunnels 24 opening into aisle 22. Above the aisle and tunnels as shown in FIG. 6 there is provided a plenum 50, similar to the plenum of FIG. 1, with openings in the ceilings, that will accept either filters 56 or impervious plates 54. Tunnels 24, in use, house the manufacturing equipment necessary to produce integrated circuit semiconductor devices. Alternatively, the process equipment may be accessible through a wall of the tunnel with the mechanical elements of equipment accessible outside of the tunnel for maintenance etc. as is known in the art. In this embodiment, this type equipment is located outside the clean area between the tunnels 24 on floor 10. A suitable entry is provided to the clean area in the aisle and tunnels, that is an air lock 26.

In FIGS. 3 and 4 the tunnels 24 are indicated in both solid lines and dotted lines. The solid lines indicate the area of the tunnels 24 that will be used in the initial phase. The combination solid and dotted lines indicate the total area of the tunnels 24 necessary for having the manufacturing line in its final phase.

The work area in tunnels 24, that is the length, is designed to meet the requirements of the final phase of manufacturing, that is the highest volume of manufacture of the integrated circuit device product. However, in the initial phase of manufacture, when volume of product is low, due to (1) lack of demand, (2) the necessity to limit the capital investment, and (3) the desire to limit the cost of development of the line by limiting the potential volume of low yield product., the entire area of the tunnels is not used. For the initial phase of manufacturing temporary partitions 28 are installed across tunnels 24 to limit the area to that area needed for the initial phase. Thus the areas of the tunnels away from the aisle 22 is not maintained as a clean area, and process equipment is not installed until it is needed at t later time. Emergency doors are provided in the partitions to provide an exit in the event of an emergency. In the ceiling above the tunnels and aisle, filters 56 are placed over the openings over the areas inside the partitions 28, and blank impervious plates 54 placed over the openings on the other sides of the partitions. This allows air to be forced into the initial areas and blocks air from being forced into the unused areas.

Referring now to FIG. 4, there is depicted the manufacturing plant that has been expanded to its final phase. The partitions 28 are removed, or opened up, and the additional area populated with processing equipment. The partitions 28 can alternately be removed or opened to provide the necessary additional area. The area can also be expanded to less than the final area to accommodate an interim expansion to less than the total area. The blank plates in the ceiling over the added area are removed and replaced with filters.

Referring now to FIGS. 5a and 5b there is depicted a portion of the lower floor showing various supply lines, exhaust lines, electrical sources and other elements.

The supply and exhaust lines necessary to service a semiconductor manufacturing line are quite extensive. Various supply lines are needed to provide water to the processing equipment. Supply line 107 provides process cooling water. Demineralized water is supplied by line 109 in the initial stages of production, and after expansion by line 111. Soft water is supplied through line 119. Returns for these supply lines are also shown - line 110 is the return for demineralized water in the initial manufacturing stage, and line 112 in the final stages. Lines 103 and 118 provide returns for process cooling water.

Supply lines are also shown that provide various gases and liquids to the manufacturing line. $H_2$ and $O_2$ are provided through supply lines 113 and 114, respectively. Lines 116 and 117 provide $N_2$, and line 115 provides dry compressed air. Additionally, solvent is supplied through line 132, and acid/caustics through line 133. Line 125 is shown for use for special gas.

Exhaust lines and drains must be provided to remove various fumes and gases from process equipment and from hoods etc. Exhaust lines must also be provided to remove various corrosive liquids and solvents for treatment and disposal. Line 120 exhausts solvents, and lines 121 and 122 exhaust scrubbed and general gases, respectively. Ammonia ($NH_3$) is exhausted through line 138. Drain 126 is used to remove solvents. Drain 127 is for removal of fluoride, and drain 128 for the removal of diluted fluoride. A first rinse drain is shown in line 129, and a last rinse drain as line 131.

Electrical power lines are also necessary to power the equipment and provide light and ventilation. Power is provided through busbar box 135 and via busbar line 136, which has a capacity of 800 amps. Various electrical cables are carried on cable tray 134.

Other elements shown include equipment and lines for handling air, and other miscellaneous items. A chilled water air-handling unit 101 and 137 is shown. Instrumentation air and breathing air are provided through lines 102 and 108, respectively. Make up air ducts 123 and 124 are shown. Also provided are fire fighting line 104, house vacuum cleaning 105 and vacuum 106.

As is apparent, the various supply and exhaust lines and drains present a formidable construction element and constitute a large part of the cost of building a manufacturing line. However, all of these supply and exhaust main and submain line are initially installed when the building is completed. This is a major feature of this invention and has the great advantage of allowing a controlled and nondisruptive expansion of the manufacturing lines. The services which go to and from the various process tunnels are shown in the following table:

| process tunnel | fluid connections | exhaust connections |
| --- | --- | --- |
| Oxidation | $O_2$, $N_2$, cooling water, D.I. waters | General exhaust, scrubber exhaust |
| Diffusion | $O_2$, $N_2$, cooling water chemical, D.I. water | General exhaust, scrubber exhaust |
| LPCVD | $N_2$, $H_2$, $SiH_4$, $Ph_3$, etc, cooling water | General exhaust, scrubber exhaust |
| Resist remove | chemical, D.I. water, solvent | General exhaust, scrubber exhaust |
| Etch | $Cl_2$, HBr, $CF_4$, $N_2$, etc | Scrubber exhaust |
| Implant | cooling water, $N_2$, CDA | General exhaust, scrubber exhaust |
| Metal | cooling water, Ar, $WF_6$, $NF_3$ | General exhaust, scrubber exhaust |
| Thin film | $SiH_4$, $NH_3$, $N_2$, etc | General exhaust, scrubber exhaust |
| Photo area | $N_2$, CDA, $H_2$ | General exhaust, solvent exhaust |

For the plant at its initial stage, the lines are only connected to the process machines installed in the initial area. Although the supply and exhaust lines for the entire plant are installed at the initial construction stage, no connections or valve stands are provided for the process equipment to be installed for the later or final stages of manufacture. The valve stands, which are very expensive, are not build until they are required. Additionally at the initial stage of manufacture it is not known precisely what processing equipment will be needed for the final manufacturing stage, nor is it known exactly where it will be placed.

FIG. 6 depicts the ceiling arrangement of the tunnels 24 (not shown in this figure), wherein a grid 94 is provided with opening which will accept either an air filter 56, or an air imperious blank panel 54. The placement of these elements has been discussed previously.

Figure 7:
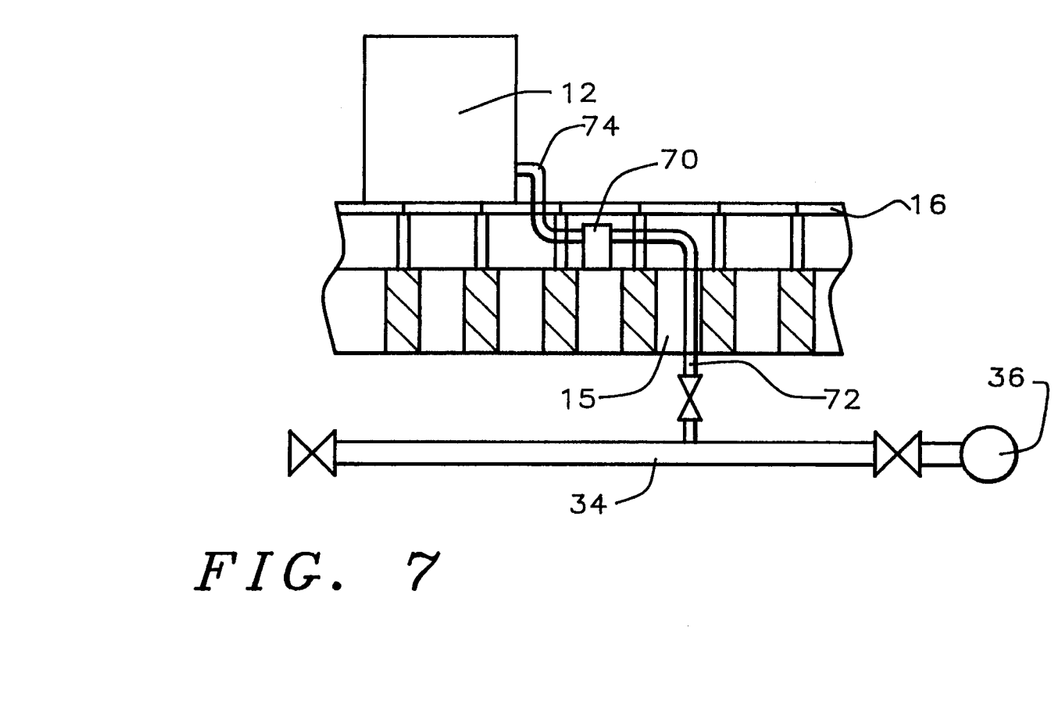
FIG. 7 is a schematic view that illustrates the details of the plumbing connections.

FIG. 7 shows schematically how the plumbing branch 72 for the sub-main drain 34 and main drain 36 pass through opening 15 in the concrete floor 14 to the valve stand 70, and are operatively connected by hook up pipe 74 to process equipment 12 supported on raised floor 16.

Obviously, modifications can be made to the aforedescribed preferred embodiments of the invention. For example, more than a single clean room standard of air can be provided in the manufacturing floor to accommodate any desired special handling systems, such as for example SMIF (Standard Mechanical Interface) handler system.

FIG. 2 depicts the recirculation of air to maintain a clean environment in the lab, that is the tunnels 24 and aisle 22 (not shown in this figure). A blower 90 forces air from the lower floor 30 into plenum and through filters (not shown) in the ceiling into the lab area. The clean air is then forced through opening 15 in the floor 14 to the lower floor where it is then recirculated, as indicated by arrows 92.

Figure 8:
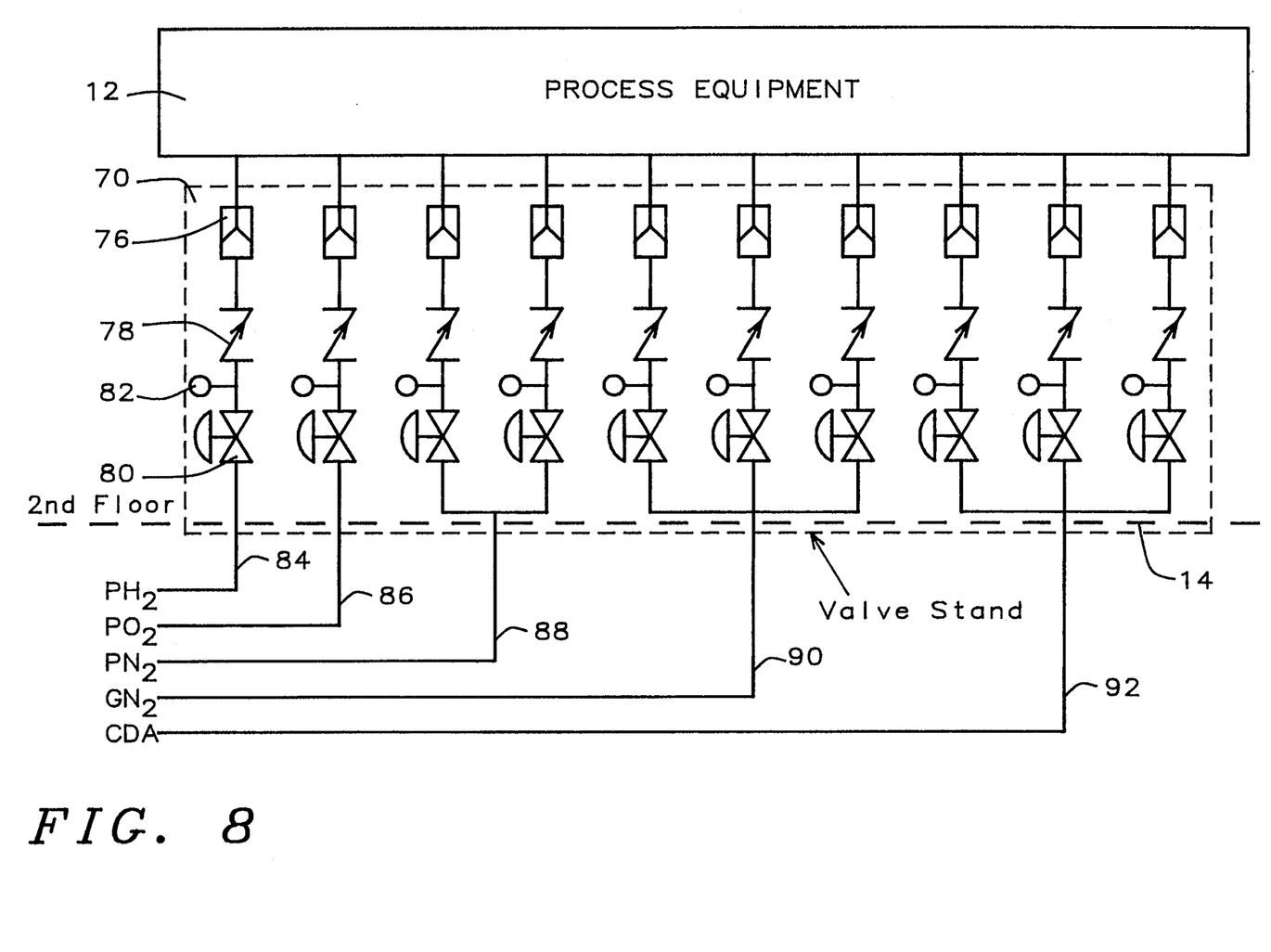
FIG. 8 is a schematic view which gives a more detailed arrangement of processing equipment with valve stand for process gases.

FIG. 8 depicts the valve stand configuration. Each line, as shown, has a filter 76 and a check valve 78 for one directional gas flow. Additionally, each line has a pressure regulator 80 and pressure indicator 82. The valve stand is located on the concrete floor 14, and connected to process equipment 12 on the raised floor. The FIG. 8 configuration includes supply/exhaust lines for process hydrogen 84, process oxygen 86, process nitrogen 88, general nitrogen 90, and compressed dry air 92.

While the invention has been particularly shown and described with reference to the preferred embodiments thereof, it will be understood by those skilled in the art that various changes in form and detail may be made therein without departing from the spirit and scope of the invention.

What is claimed is:

1. A plant for the manufacture of integrated circuit semiconductor devices, that is initially sized to accommodate the initial phase of low volume manufacturing capability, but adapted to be economically expanded to provide a high volume final phase manufacturing capability with a minimum disruption to the operating manufacturing line, that includes a containment building having a (1) manufacturing equipment floor and (2) a lower basement floor beneath the manufacturing equipment floor comprising:

an enclosed process aisle, including a ceiling, on said manufacturing floor;

a plurality of spaced tunnels, each including walls and a ceiling, opening into said aisle, and adapted to contain manufacturing equipment or have access to manufacturing equipment through a tunnel wall;

means to provide a clean air environment within said aisle and tunnels, said means to provide clean air including a plenum system over said ceilings, openings in said ceilings, and a means to force air into said plenum, through said opening into said tunnel;

service areas on said manufacturing floor outside of said aisle and said tunnels;

air lock entry means to said aisle;

partitions across said tunnels that separate the initial area in the tunnels needed to accommodate the initial phase of manufacturing from the remaining area in the tunnels that will ultimately be used along with initial area for the final phase of manufacturing;

manufacturing equipment within or accessible to said initial area of said tunnels;

air filters over said openings in said ceilings over the initial areas of said tunnels;

impervious panels over said openings in said ceilings over said remaining areas of said tunnels;

fluid supply lines beneath the tunnels, necessary to service all of the manufacturing equipment used in the initial phase and equipment to be added in the final phase in the tunnels; and plumbing connections and valves joining said supply lines to said manufacturing equipment to be used in the initial area.

2. The plant of claim 1 wherein said means to exhaust air from the tunnels is a plurality of openings in the floor of said manufacturing equipment floor.

3. The plant of claim 2 wherein said supply lines to said manufacturing equipment is located in said lower basement floor and extends parallel to the longitudinal axis of said tunnels.

4. The plant of claim 3 wherein plumbing connections from said supply lines to said manufacturing equipment is made through said openings in said floor of said manufacturing floor.

5. The plant of claim 4 wherein said plumbing connections include a valve stand.

6. The plant of claim 5 wherein said valve stand is located above said floor of said manufacturing floor.

7. The plant of claim 6 wherein said manufacturing floor includes a raised floor above said floor of said manufacturing floor within said tunnels.

8. The plant of claim 7 wherein said valve stand is located beneath said raised floor.

9. The plant of claim 1 wherein said means to provide a clean environment provides for a blower to force air from said lower basement floor into said plenum, through said air filters and into said tunnels, and out through said openings in said floor of said manufacturing floor into said lower basement floor.

10. A method of building a plant for the manufacture of integrated semiconductor devices for an initial phase of low volume manufacturing capability and later converting to a high volume final phase of manufacturing capability that provides a minimum disruption of the operating manufacturing line and the expenditure of a minimum initial capitol investment, comprising:

constructing a containment building having a (1) manufacturing equipment floor, and (2) a lower basement floor beneath the manufacturing equipment floor;

constructing an enclosed process aisle, including a ceiling, on said manufacturing floor;

constructing a plurality of spaced tunnels, each tunnel including walls and a ceiling, opening into said aisle, said tunnels each adapted to contain manufacturing equipment or to have access to manufacturing equipment through tunnel walls;

constructing a means to provide a clean air environment within said aisle and tunnels, said means to provide clean air including a plenum system over said ceilings, openings in said ceilings, a means to force air into said plenum through said openings into said tunnel and aisle, and a means to exhaust air from said tunnels and aisle;

constructing walls across said tunnels that separate the total area of the tunnels into (1) initial areas needed to accommodate the initial phase of manufacturing and (2) remaining areas that will ultimately be used along with the initial area for the final phase of manufacturing;

providing manufacturing equipment within or accessible to said initial area of said tunnels;

providing filters over said openings in said ceilings of said aisle and ceilings of said initial areas of said tunnels;

providing air impervious panels over said openings in said ceilings over said remaining areas of said tunnels;

providing complete fluid supply lines beneath the tunnels necessary to service all of the manufacturing equipment used in the initial phase and the equipment to be added for the final phase;

providing plumbing connections and valves for joining said supply lines to said manufacturing equipment provided for said initial phase; and subsequently modifying the plant for the final phase of manufacturing by (1) installing manufacturing equipment in the remaining area of said tunnels, (2) connecting said fluid supply lines to the newly installed equipment, (3) removing said impervious panels from the openings in the ceilings over said remaining area, (4) covering the openings with air filters, and (5) opening said partitions in said tunnels.

11. The method of claim 10 wherein said means to exhaust air from the tunnels is a plurality of openings in the floor of said manufacturing equipment floor.

12. The method of claim 11 wherein said supply lines to said manufacturing equipment is located in said lower basement floor and extends parallel to the longitudinal axis of said tunnels.

13. The method of claim 12 wherein plumbing connections from said supply lines to said manufacturing equipment is made through said openings in said floor of said manufacturing floor.

14. The method of claim 13 wherein said plumbing connections include a valve stand.

15. The method of claim 14 wherein said valve stand is located above said floor of said manufacturing floor.

16. The method of claim 15 wherein said manufacturing floor includes a raised floor above said floor of said manufacturing floor within said tunnels.

17. The method of claim 16 wherein said valve stand is located beneath said raised floor.

18. The plant of claim 10 wherein said means to provide a clean environment provides for a blower to force air from said lower basement floor into said plenum, through said air filters and into said tunnels, and out through said openings in said floor of said manufacturing floor into said lower basement floor.

* * * * *